Feb. 9, 1960 | A. HERLET | 2,924,760

POWER TRANSISTORS

Filed Nov. 25, 1958

2,924,760

POWER TRANSISTORS

Adolf Herlet, Pretzfeld/Ofr., Schloss, Germany, assignor to Siemens-Schuckertwerke Aktiengesellschaft, Berlin-Sie-Mensstadt, Germany Application November 25, 1958, Serial No. 776,323

Claims priority, application Germany November 30, 1957

4 Claims. (Cl. 317—235)

Figures 1A, 1B, 2A, 2B, 3A, 3B, 4A, 4B, 5:
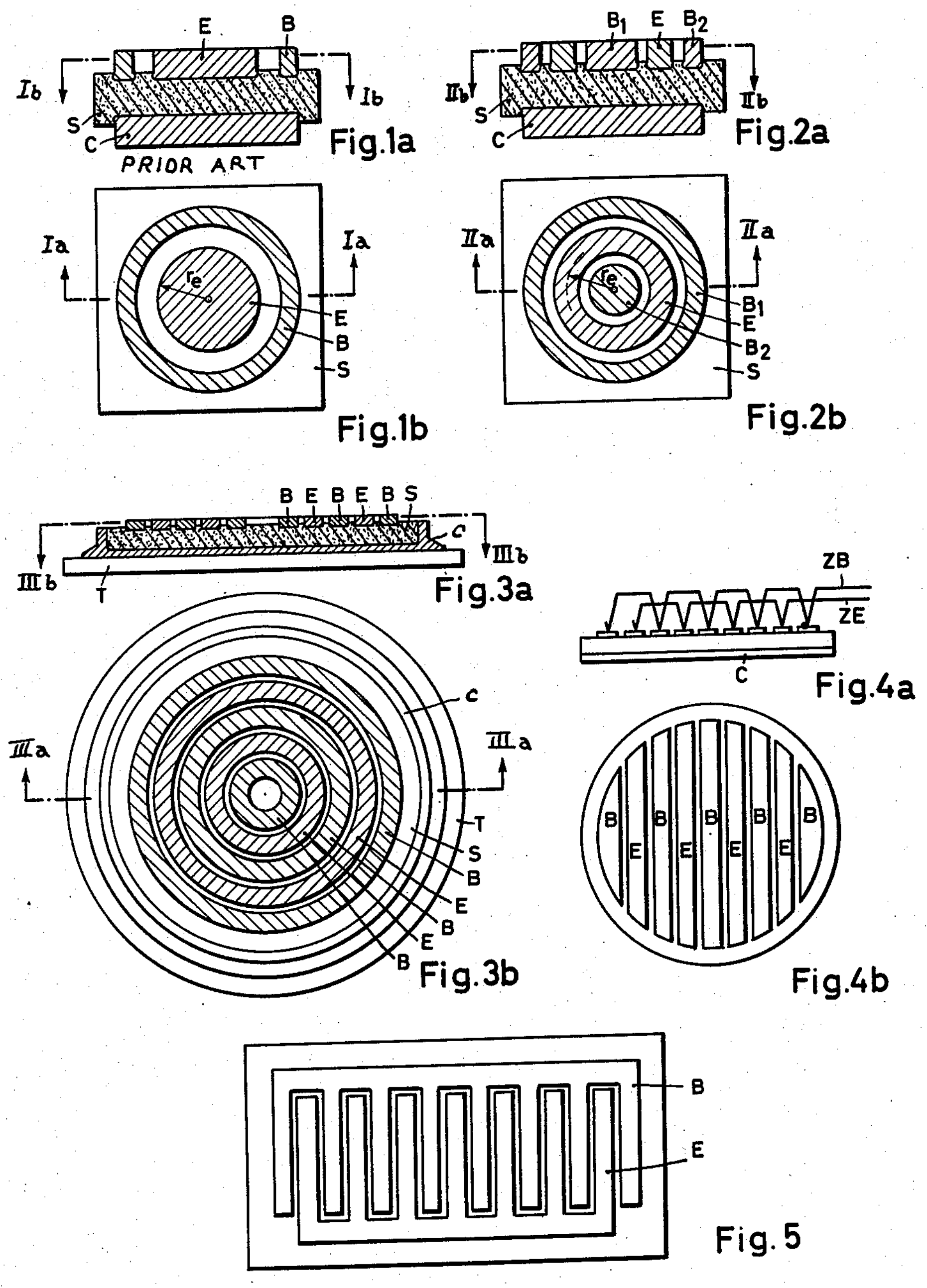

My invention relates to power transistors consisting of a monocrystalline silicon plate with at least two heavily doped regions of one conductance type, namely an emitter region and a collector region, and an intermediate, less heavily doped base region of the other conductance type. Such semiconductor devices of silicon or germanium are generally known as p-n-p or n-p-n transistors. In known silicon power transistors, the collector electrode occupies the major portion of one of the flat sides of the silicon plate, whereas the emitter electrode and the base electrode cover respective areas on the other flat side in spaced relation to each other, usually so that the emitter is circular and the base forms an annular strip around the emitter.

It is an object of my invention to increase the efficacy and current carrying capacity of such power transistors for any given size; and it is another object to achieve this without increasing the manufacturing cost beyond the economical limit of mass production.

To this end, and in accordance with a feature of my invention, I subdivide the base electrode into two or more parts spaced from each other to form an intermediate gap, and locate the emitter electrode in form of a strip in that gap, the emitter strip having a width substantially equal to $2\sqrt{2}$ times the diffusion length at high injection, aside from covering a total area of several square millimeters sufficient for power current purposes. The term "high-injection" relates to the operating condition of the semiconductor device as a power transistor, that is to a charge-carrier injection sufficient to raise both (n,p) charge-carrier concentrations in the base region of the semiconductor crystal considerably above the level of the doping (donor, acceptor) concentration.

The following explanation will aid in understanding the invention. A portion of the driving voltage applied between the emitter and base of a transistor is effective between the p-n junction proper which is located between emitter region and base region. Another portion of the driving voltage is consumed within the base region for laterally driving off the base current. In principle, such lateral voltage drop is always present; but it becomes appreciable only if the base region is subjected to the condition of high injection, that is when both carrier concentrations are raised far above the doping concentration. This condition obtains, as a rule, in power transistors operating with high collector currents. Hence, at such current loads the voltage drop due to the lateral flow of base current is so large as to appreciably reduce the voltage drop at the p-n junction. Considering different current flow paths in the semiconductor, such reduction in junction voltage is the greater the more the origin point of the current path is remote from the edge of the emitter. As a result, the carrier injection from the emitter decreases in exponential relation to the residual local voltage at the p-n junction.

Based upon these phenomena is the recognition, which lead to my invention, that the interior area elements of the centrally located emitter in the known power transistors contribute less to the emitter current than the marginal area elements. It has been found that in a silicon n-p-n transistor of the known type described above, the circular, centrally located emitter area is effective substantially only at its outer marginal zone having a width of $\sqrt{2}\,L_p$ if the radius of the circular emitter is large relative to the amount of $\sqrt{2}\,L_p$, $L_p$ being the diffusion length in the base region at high injection. This finding is based upon the simplified assumption that, with a sufficiently heavy doping of the emitter region and a slight spacing between emitter and base, only the volume recombination is to be taken into account for determining the base current, so that the emitter current can be considered as 100% effective and the surface recombination be neglected. In contrast to such limited utilization of the emitter area in the known power transistors, the invention, by virtue of the subdivision of the base electrode and the provision of a large-area emitter in form of a strip about $2\sqrt{2}\,L_p$ wide in the gap of the base electrode, greatly increases the efficacy and thus permits a higher current loading of a power transistor of given size. This will be more fully explained below with reference to the drawing in which:

Figs. 1*a* and 1*b* are a cross section and a sectional plan view of a transistor according to the prior art, the sections being along the lines I*a*—I*a* and I*b*—I*b*, respectively.

Figs. 2*a* and 2*b* are a cross section and a sectional plan view of an embodiment of a power transistor according to the invention, the sections being along lines II*a*—II*a* and II*b*—II*b*, respectively.

Figs. 3*a* and 3*b* are a cross section and a sectional plan view of another embodiment of a power transistor according to the invention, the section lines being denoted by III*a*—III*a* and III*b*—III*b*.

Figs. 4*a* and 4*b* are a plan view and a side view respectively of a third transistor according to the invention; and Fig. 5 is a plan view of still another embodiment of the invention.

All illustrations are on enlarged scale.

The example of a power transistor according to the prior art illustrated in Figs. 1*a* and 1*b* comprises a silicon plate S of p-type conductance whose area is of square shape has an edge length of 8 mm., for example. The bottom side of the silicon plate S, whose original thickness was 0.08 mm., is provided with a collector C which nearly covers the entire bottom side. The collector is produced by alloying into the surface zone of the silicon plate a gold foil containing 1% antimony and having a thickness of 0.04 mm. A p-n junction extends over the entire area of the collector facing the interior of the silicon plate. Also joined with the silicon plate by alloying is an emitter E of circular shape whose radius is denoted by $r_e$. The emitter, located on the other flat side of the plate, is concentrically surrounded by a ring-shaped base contact B which is formed by alloying in a ring-shaped aluminum foil of 0.04 mm. For testing purposes, a number of silicon transistors of this type were produced with respectively different diameters of the emitter area, but with always the same marginal spacing of the base ring. The emitter currents were measured, with an amplification factor $\alpha=10$, in dependence upon the emitter radius. The results confirmed the above-mentioned linear dependence of the emitter currents upon the emitter diameter, in contrast to the square-law of increase in emitter area.

A better utilization of the emitter area and therefore also of the semiconductor area, was obtained with the transistor type according to the invention illustrated in Figs. 2*a* and 2*b*. In this power transistor the area of the emitter had the same size as in the above-described transistor of Figs. 1*a* and 1*b*, and the production of the electrodes by alloying them together with the silicon body, as well as the materials used were also the same. However, in the transistor according to Figs. 2*a*, 2*b*, the emitter area is formed by a ring-shaped strip E, and the base electrode is subdivided into a base ring $B_1$ surrounding the emitter ring and a base electrode $B_2$ of circular shape concentrically located within the emitted ring. The utilizable marginal area of the emitter ring E is twice as large as with the power transistor according to Figs. 1*a* and 1*b*, so that under otherwise equal conditions the magnitude of the emitter current is doubled.

In the foregoing comparison of the two transistors it is assumed that the median radius $r_e$ according to Figs. 2*a* and 2*b* is equal to the radius $r_e$ of the circular emitter area according to Figs. 1*a* and 1*b*, and that the width of the emitter ring E in Figs. 2*a*, 2*b* is equal to one-half of that radius, namely 0.5 $r_e$. In accordance with my invention, the emitter strip according to Figs. 2*a*, 2*b* is given a width as close as possible to the most favorable value of $2\sqrt{2}\ L_p$. If the width is made considerably larger, the utilization of the emitter area is too slight, and with a considerably smaller width for a given emitter area the length of the emitter strip becomes too large so that, for a given median radius, the number of emitter rings would have to be increased with result of increasing the manufacturing cost without improving the area utilization to a corresponding degree.

In commercial manufacture, satisfactory power transistors according to Figs. 2*a* and 2*b* have been produced by alloying with the silicon disc respective emitter strips of 0, 8 and 1 mm. width in accordance with the illustrated ring pattern; and a spacing between 0.05 and 0.1 mm. was provided between the emitter ring E and the simultaneously alloyed two portions $B_1$ and $B_2$ of the base electrode. With these widths, the above-mentioned ring shaped foils of gold and aluminum should be conveniently manipulated prior to the alloying process proper. One of the alloying methods used consisted in embedding the silicon plate together with the shaped foils for the base, emitter and collector in graphite powder in proper position relative to one another, and then heating the entire assembly to the alloying temperature. This method is more fully described in the copending application of R. Emeis, Serial No. 637,029 filed January 29, 1957, and assigned to the assignee of the present invention. The ring-shaped electrodes thus alloyed together with the silicon disc readily permitted attaching the connecting leads of wire or metal strips by soldering. The above-mentioned width of the emitter strip, amounting to 0.8 or 1 mm., closely approaches the optimum for best utilization of the emitter area, because the diffusion length $L_p$ at high injection may attain the amount of 0.3 mm. Subsequent checking is possible by determining the diffusion length $L_p$ in the known manner from the measurable $a$-value and the thickness of the base electrode.

The dimensioning of the emitter width according to the invention is also of advantage if the measured diffusion length $L_p$ has smaller values, for example 0.2 or 0.1 mm., because foil strips of smaller width have very little stiffness and for that reason are more difficult to manufacture and to manipulate, and the attachment of the current supply leads is more difficult. Furthermore, the entire emitter area in each case covers only approximately one-third of the original semiconductor surface so that if one goes beyond the most favorable width of the emitter strip by the factor 3, only 20% of the total area on one side of the silicon plate is insufficiently utilized. This is economically justifiable in comparison with the otherwise necessary increase in manufacturing cost and in some cases is also of advantage with respect to cooling conditions. However, it is also possible, for example by depositing the electrode metal by vaporization or electrolytically, to produce emitter strips, and if desired also base contacts, of smaller widths down to approximately 0.4 mm., to which current supply leads can be attached at economical cost. The choice of emitter-strip widths of such small magnitudes still realizes the features and essential advantages of the invention even at greater values of $L_p$ up to about 0.5 mm., because in this case a particularly uniform and high utilization of the emitter area is achieved and because slight departures upwardly or downwardly from the most favorable value $2\sqrt{2}\ L_p$ are sometimes advantageous for certain operating conditions or for the above-mentioned reasons of manufacture.

In the modified power transistor according to Figs. 3*a* and 3*b*, the base electrode is further subdivided, and the emitter electrode is also subdivided so that the illustrated rings form alternately part of the emitter E and part of the base B. The largest emitter ring E is surrounded by a still larger base ring, and a base ring is located within the smallest emitter ring, so that base strips are located on both sides of each individual emitter strip. As a result the entire marginal length of the composite emitter area is effectively utilized. If desired, the innermost base electrode ring may also consist of a full circular area.

Power transistors have been produced in accordance with such a multiple-ring pattern by alloying into the silicon body S two ring foils of antimony-containing gold and three aluminum foils, all of 1 mm. width. These power transistors were tested and were found to be suitable for up to 20 amps. output current flowing through emitter and collector when operating with 2.5 amps. of base current. The collector C was made from a gold-antimony foil of somewhat larger diameter than the silicon disc S. This had the effect that the alloy formation between Si and Au/Sb also extended to the peripheral side of the Si disc. The resulting formation of the collector C is apparent from Fig. 3*a*. It has the advantage that the external p-n boundary of the collector-side p-n junction is located on the upper flat surface of the silicon disc and hence is just as conveniently accessible for such purposes as etching and cleaning, as the external p-n boundaries of the emitter-side p-n junctions. A carrier plate T, for example of tungsten or molybdenum, can be subsequently attached to the underside of the collector. For this purpose, a molybdenum disc, for example, may first be provided electrolytically with a gold coating which is then heated to a temperature of 800 to 900° C. to become firmly adherent. The carrier plate, thus prepared, can then be firmly joined with the transistor element by heating both temporarily up to approximately 400° C. without ascertainably affecting the previously formed layer structure and electrical properties of the transistor.

In the transistor element shown in Figs. 4*a* and 4*b*, the emitter and base electrodes form a straight strip pattern. A base contact strip B is located on both sides respectively of each of the emitter strips E. All strips may have the width, for example 0.8 to 1 mm. The electrode strips pertaining to one and the same electrode are to be electrically interconnected, as in all other embodiments. The interconnection according to Fig. 4*a* is effected by means of bent metal strips ZE soldered to all emitter strips, and ZB soldered to all base strips. The current-supply strip ZE may consist of copper which is first galvanically plated with silver, then gold coated, and ultimately welded to the electrode strips at the points of contact engagement. A similar current-supply strip ZB may first be coated with tin at the points of contact and then be soldered to the etched aluminum strips B which are likewise tin-coated at the points of contact engagement. Several such supply leads may be provided for the base strips and particularly also for the emitter strips because the latter, as a rule, carry higher currents. In the same manner, transistors embodying a ring pattern as shown in Figs. 2*a*, 2*b* or 3*a*, 3*b*, may be provided with such current-supply conductors. The conductors may also be arranged in crosswise or star-wise relation to each other, whereas in a straight-strip pattern, according to Figs. 4*a*, 4*b*, the respective conductors are preferably mounted one longitudinally beside the other.

The transistor shown in Fig. 5 has its base and emitter electrode arranged in a comb-shaped pattern known as such. The strips pertaining to the emitter E extend into the comb gaps of the base contact area B. The width of the emitter strips E, and preferably also the corresponding strips of the base B, are to be given a width substantially equal to $2\sqrt{2}\ L_p$ in accordance with the invention, this width is between 0.1 and 1 mm.

While the invention is described above with reference to examples of n-p-n power transistors, it is analogously applicable to transistors of the p-n-p type. In the latter case the value $L_p$ is to be replaced by the diffusion length $L_n$ in the n-conducting base region. The dimensions applying to such p-n-p transistors are substantially the same as given above for n-p-n transistors.

I claim:

1. A power transistor, comprising a monocrystalline silicon plate having joined therewith a base electrode, an emitter and a collector and having heavily doped regions of one conductance type adjacent to said emitter and collector respectively, and a relatively lightly doped region of the other conductance type connected to said base electrode by a non-rectifying connection, said two heavily doped regions on the one hand and said lightly doped region on the other hand forming respective p-n junctions at their mutual boundaries, said collector covering a major portion of one flat side of said plate, said base electrode having a plurality of mutually spaced portions covering part of the other side of said plate and forming a gap between each other, said emitter being strip-shaped and covering part of said other side in said gap, said emitter having a total area of several square millimeters for carrying power current and having a strip width approximately equal to $2\sqrt{2}$ times the diffusion length at high injection.

2. In a silicon power transistor according to claim 1, said width of said strip-shaped emitter departing from the exact value of $2\sqrt{2}$ times the diffusion length at most by the factor three.

3. In a silicon power transistor according to claim 1, said width of said strip-shaped emitter being between 0.4 and 1.0 mm.

4. A silicon power transistor according to claim 1, comprising a plurality of ring-shaped and cocentric emitter strips, conductively connected with each other, and said base electrode having respective portions located around the largest emitter ring and within the smallest emitter ring respectively, said portions being conductively connected with each other.

References Cited in the file of this patent

UNITED STATES PATENTS 2,754,431 Johnson ---------------- July 10, 1956
2,771,382 Fuller ----------------- Nov. 20, 1956